(12) United States Patent
Furuya et al.

(10) Patent No.: US 12,412,756 B2
(45) Date of Patent: Sep. 9, 2025

(54) PROCESSING LIQUID SUPPLY DEVICE, SUBSTRATE PROCESSING APPARATUS, AND METHOD FOR INSPECTING PROCESSING LIQUID SUPPLY DEVICE

(71) Applicant: SHIBAURA MECHATRONICS CORPORATION, Kanagawa (JP)

(72) Inventors: Masaaki Furuya, Kanagawa (JP); Hiroaki Kobayashi, Kanagawa (JP); Hideki Mori, Kanagawa (JP)

(73) Assignee: SHIBAURA MECHATRONICS CORPORATION, Kanagawa (JP)

( * ) Notice: Subject to any disclaimer, the term of this patent is extended or adjusted under 35 U.S.C. 154(b) by 215 days.

(21) Appl. No.: 18/125,310

(22) Filed: Mar. 23, 2023

(65) Prior Publication Data
US 2023/0307263 A1 Sep. 28, 2023

(30) Foreign Application Priority Data
Mar. 24, 2022 (JP) .................. 2022048903

(51) Int. Cl.
*H01L 21/67* (2006.01)

(52) U.S. Cl.
CPC .... *H01L 21/6708* (2013.01); *H01L 21/67248* (2013.01); *H01L 21/67253* (2013.01)

(58) Field of Classification Search
CPC ............. B05C 11/1002; B05C 11/1007; B05C 11/1015; B05C 11/1036; B05C 11/1039; B05C 11/1042; B05C 11/1044; B05C 11/1047; H01L 21/02019; H01L 21/02041; H01L 21/306; H01L 21/30604;
(Continued)

(56) References Cited

U.S. PATENT DOCUMENTS

2015/0262737 A1* 9/2015 Hinode ............... H01L 21/6708
156/345.18
2016/0042981 A1 2/2016 Sato et al.
(Continued)

FOREIGN PATENT DOCUMENTS

JP 2007-273791 A 10/2007
JP 2018026537 A * 2/2018 ........... F16K 37/005
(Continued)

*Primary Examiner* — Michael A Tolin
(74) *Attorney, Agent, or Firm* — Venjuris, P.C.

(57) ABSTRACT

According to one embodiment, a processing liquid supply device includes: a tank that stores the processing liquid; a supply path that supplies the processing liquid to the processing device; a heater that heats the processing liquid; a thermometer that measures a temperature of the processing liquid; a densitometer that measures a concentration of the processing liquid; and a controller including an inspecting unit that inspects the densitometer. The inspecting unit includes: a temperature setting device that sets a boiling point temperature at which a predetermined concentration is reached as a predetermined temperature; a heating controller that heats the processing liquid by the heater so as to reach a target temperature within a predetermined range; and a determination device that determines whether or not the concentration of the processing liquid is a target concentration within a predetermined range based on the predetermined concentration.

7 Claims, 4 Drawing Sheets

(58) Field of Classification Search
CPC ............. H01L 21/311; H01L 21/31105; H01L 21/31111; H01L 21/67017; H01L 21/67023; H01L 21/67063; H01L 21/67075; H01L 21/6708; H01L 21/67086; H01L 21/67098; H01L 21/6715; H01L 21/67242; H01L 21/67248; H01L 21/67253; H01L 22/00; H01L 22/10; H01L 22/20; H01L 22/26

See application file for complete search history.

(56) References Cited

U.S. PATENT DOCUMENTS

| | | |
|---|---|---|
| 2016/0184859 A1 | 6/2016 | Kamimura et al. |
| 2016/0271657 A1* | 9/2016 | Sato .................. B08B 3/10 |
| 2018/0158700 A1 | 6/2018 | Shomori et al. |

FOREIGN PATENT DOCUMENTS

| | | |
|---|---|---|
| KR | 10-2016-0019379 A | 2/2016 |
| KR | 10-2016-0078244 A | 7/2016 |
| KR | 10-2018-0017183 A | 2/2018 |

* cited by examiner

PROCESSING LIQUID SUPPLY DEVICE, SUBSTRATE PROCESSING APPARATUS, AND METHOD FOR INSPECTING PROCESSING LIQUID SUPPLY DEVICE

CROSS-REFERENCE TO RELATED APPLICATIONS

This application is based on and claims priority from Japanese Patent Application No. 2022-048903 filed on Mar. 24, 2022 with the Japanese Patent Office, the disclosure of which is incorporated herein in its entirety by reference.

TECHNICAL FIELD

The present disclosure relates to a processing liquid supply device, a substrate processing apparatus, and a method for inspecting the processing liquid supply device.

BACKGROUND

In a manufacturing process of semiconductors, flat panel displays, etc., a processing device is used to perform an etching process by supplying an etching processing liquid to a film formed on a surface of a substrate such as a semiconductor wafer or a glass substrate thereby forming a desired circuit pattern on the substrate.

For example, with the recent miniaturization of circuit patterns, a single-wafer type processing device in which a processing liquid is supplied to a rotating substrate to process substrates one by one may have a higher level of uniformity in a processing for each substrate than a batch type processing device in which several substrates are immersed in a processing liquid to process the substrates in a batch, and therefore, is widely used.

SUMMARY

In an embodiment of the present disclosure, a processing liquid supply device includes: a tank that stores a processing liquid; a supply path that supplies the processing liquid from the tank to a processing device that processes a substrate with the processing liquid; a heating unit that heats the processing liquid; a thermometer that measures a temperature of the processing liquid; a densitometer that measures a concentration of the processing liquid; and an inspecting unit that inspects the densitometer. The inspecting unit includes: a temperature setting unit that sets a boiling point temperature at which a predetermined concentration is reached as a predetermined temperature, based on an atmospheric pressure at a place where the processing liquid supply device is installed and a preset vapor pressure curve of the processing liquid; a heating control unit that controls the heating unit to heat the processing liquid to a target temperature within a predetermined range based on the predetermined temperature; and a determination unit that determines whether the concentration of the processing liquid that reaches the target temperature, which is measured by the densitometer, is a target concentration within a predetermined range based on the predetermined concentration.

A substrate processing apparatus of the embodiment of the present disclosure includes the processing device and the processing liquid supply device.

In an embodiment of the present disclosure, a method for inspecting a processing liquid supply device includes: setting a boiling point temperature at which a predetermined concentration is reached as a predetermined temperature, based on an atmospheric pressure at a place where the processing liquid supply device is provided to supply the processing liquid to the processing device that processes the substrate with the processing liquid, and a preset vapor pressure curve of the processing liquid; heating the processing liquid by a heating unit so that a temperature of the processing liquid measured by a thermometer reaches a target temperature based on the predetermined temperature; and when the processing liquid reaches the target temperature, determining whether a concentration of the processing liquid measured by a densitometer that measures the concentration of the processing liquid is a target concentration within a predetermined range based on the predetermined concentration.

The embodiments of the present disclosure may provide the processing liquid supply device capable of inspecting the function of the densitometer, the substrate processing apparatus, and the method for inspecting the processing liquid supply device.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENTS

Figure 1:
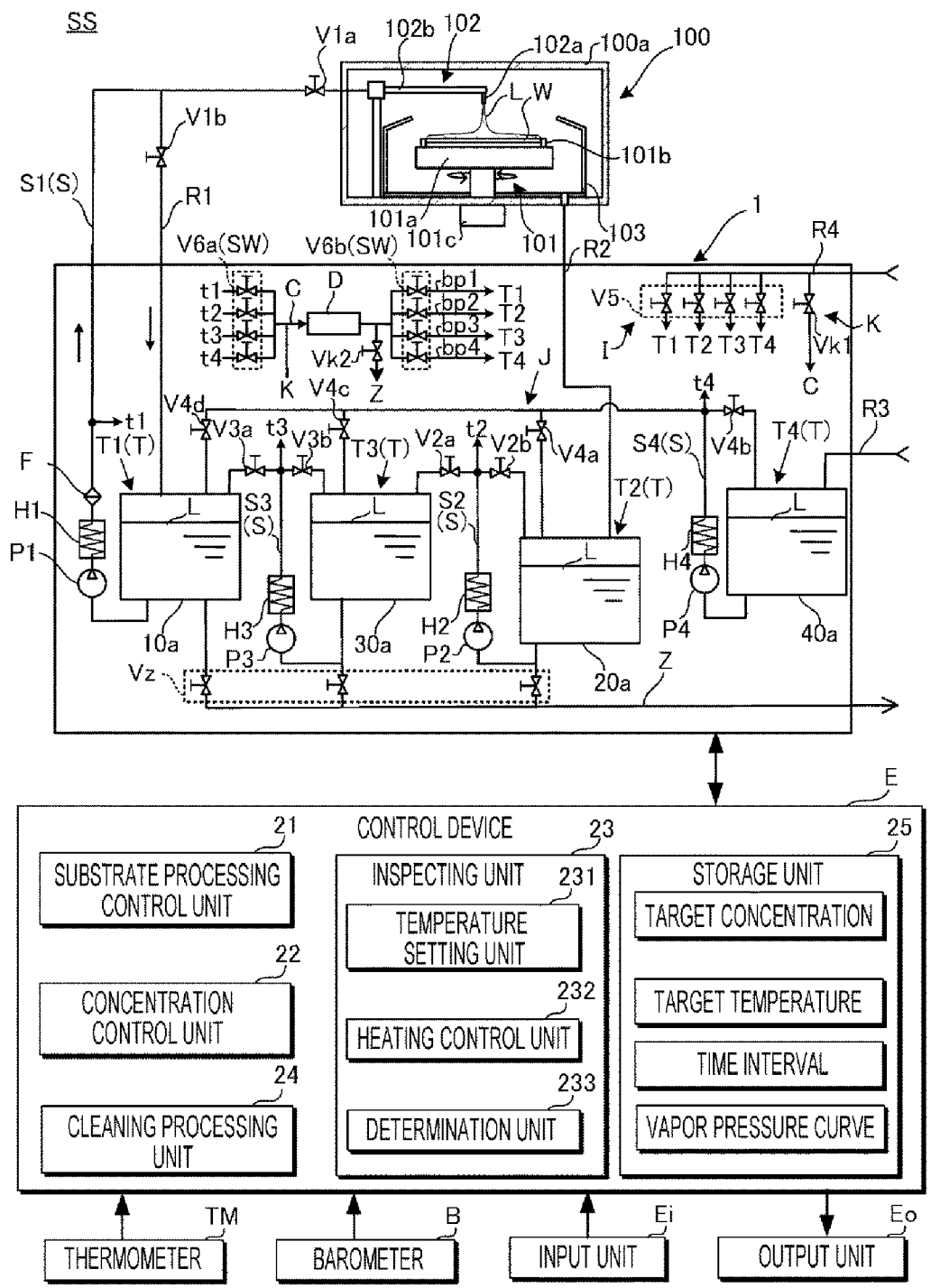
FIG. 1 is a schematic configuration view illustrating a processing device and a processing liquid supply device of an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

The single-wafer type processing device, which processes one sheet of substrate at a time, has a relatively low productivity as compared to the batch type processing device unless the processing time for each sheet of substrate is shortened in the single-wafer type processing device. For this reason, in order to increase the productivity in the single-wafer type processing device while maintaining a high processing performance, the processing needs to be performed within a short time period with little fluctuation in the single-wafer type processing device. In the batch type processing device, the fluctuations in parameters such as the temperature and concentration of the processing liquid may be adjusted inside a processing bath by taking time before a processing, and the substrates may then be immersed. However, in the single-wafer type processing device, the processing liquid needs to be supplied to the substrate in such a way that the parameters affecting the process performance are always kept constant.

Further, in the batch type processing device or single-wafer type processing device, the processing liquid used in the processing may need to be recovered and reused from the viewpoint of reducing the processing costs. Even in the case of reusing the processing liquid, the batch type processing device may check and adjust the parameters within a relatively long processing time of immersion in the processing bath. However, the single-wafer type processing device processes each substrate in a relatively short time. Therefore, the fluctuations in the parameters of the processing liquid supplied to the substrate causes a non-uniformity in the processing performance for processing the substrate, and the non-uniformity appears in products. For this reason, the processing liquid, including the recovered processing liquid, always needs to be adjusted to the optimum concentration or temperature, to be continuously supplied to the substrate. In other words, in the single-wafer type processing device, the fluctuations in the concentration and temperature of the processing liquid always needs to be suppressed within a very small range.

In general, the recovered liquid tends to greatly affect the fluctuation in the temperature of the processing liquid. In other words, since the temperature of the processing liquid used in the processing decreases, the used processing liquid needs to be recovered and the temperature of the recovered processing liquid needs to be raised again. However, a specific measure is required in order to maintain and supply the recovered liquid at a relatively high temperature. For example, the amount of recovered liquid fluctuates at the processing timing. In particular, when a processing is performed in a plurality of processing chambers at the same time, the recovery amount also fluctuates greatly over the time. In a configuration in which the recovered liquid is collected, heated and reused in a tank, the temperature fluctuates greatly according to the inflow amount of the recovered liquid.

In contrast, regarding the concentration of the processing liquid, since the concentration needs to be adjusted by heating the processing liquid over an extended period of time or by adding a dilution liquid such as pure water, the adjustment is performed in a supply tank. Since the recovered liquid is converted into the processing liquid by adjusting the concentration in the supply tank, the range for the concentration adjustment tends to be relatively small. However, when the processing liquid is expensive and in order to increase the recovery rate of the processing liquid and reduce the processing cost, even a processing liquid mixed with a certain amount of liquid having no difficulty in reuse such as a rinse liquid is recovered and reused. For this reason, it is important to restore the concentration of the processing liquid that has been used in the processing.

Even when the concentration of the recovered liquid is necessarily low, in a recovery tank where no processing is performed for an extended period of time and a newly recovered liquid does not flow into, heating is always performed to maintain the temperature of the liquid in the recovery tank at a high temperature, so that water contained in the recovered liquid is evaporated and the concentration of the recovered liquid increases over the time period. Since the substrate processing is not performed while the recovered liquid does not flow into, the amount of liquid in the supply tank, which sends the recovered liquid to the recovery tank, does not decrease, which further increases the concentration of the liquid in the recovery tank. Accordingly, concentration control is also important in the recovery tank.

Japanese Patent Laid-Open Publication No. 2007-273791 discloses a single-wafer type substrate processing apparatus proposing a method of maintaining the temperature constantly when recovering and reusing the processing liquid in the single-wafer type processing apparatus. In the substrate processing apparatus, two tanks are provided to supply the recovered liquid to a processing unit, and the substrate is processed by alternately switching the connection between the processing unit and the tanks. A densitometer is provided in each tank, and the deterioration of the processing liquid is determined by the measured value of the densitometer. An operation for replacing the processing liquid is performed on the tank in which the processing liquid is deteriorated.

When a wafer having a fine pattern is etched in the single-wafer type substrate processing apparatus, the etching rate becomes ununiform due to the variation in the concentration and temperature of the processing liquid, leading product quality problems. For this reason, the parameters of the concentration and temperature of the processing liquid supplied to the substrate largely affect the processing performance. In particular, when it is not readily determined that the densitometer is being operated in a normal condition, a product defect may be generated.

More specifically, in order to supply the processing liquid at a temperature slightly lower than the boiling point and in a stable state with a constant concentration, it is necessary to control both the added amount of the diluent and the liquid temperature by heating with a heater based on the concentration value measured by the densitometer. When the concentration value of the densitometer deviates due to, for example, dirt, a predetermined etching processing may not be performed on the product processed with the processing liquid since the concentration of the processing liquid is not correct. However, at present, there is no function or measure for inspecting the function of the densitometer in the substrate processing apparatus.

The embodiments of the present disclosure provide a processing liquid supply device capable of inspecting the function of a densitometer, a substrate processing apparatus, and a method for inspecting the processing liquid supply device.

Hereinafter, embodiments of the present disclosure will be described with reference to the drawings.

SUMMARY

As illustrated in FIG. 1, a processing liquid supply device 1 of an embodiment is a device that supplies a processing liquid L to a processing device 100 that processes a substrate W with the processing liquid L by passing the processing liquid L through a plurality of tanks T sequentially. The processing liquid supply device 1 is provided with a single densitometer D which is provided in a common flow path C through which the processing liquid L flows from the plurality of tanks T. The processing liquid supply device 1 measures the concentration of the processing liquid L in each tank T while switching the tanks T from which the processing liquid L flows through the common flow path C by a switching unit SW, and adjusts the amount of diluent to be added to the processing liquid L in each tank T and a heating temperature of the processing liquid L so that the concentration of the processing liquid L in each tank T reaches a target concentration within a predetermined range based on a predetermined concentration (e.g., a set concentration). In the following description, an apparatus that performs a processing while circulating the processing liquid L between the processing liquid supply device 1 and the processing device 100 is referred to as a substrate processing apparatus SS.

Further, in the processing liquid supply device 1 of the embodiment, the air pressure at a place where the processing liquid supply device 1 is placed is measured by a barometer B, and the boiling point temperature at which the processing liquid L reaches a predetermined concentration is obtained from a vapor pressure curve of the processing liquid L, which is obtained in advance. The boiling point temperature obtained as described above is set as a predetermined temperature (e.g., a set temperature), and the processing liquid L is heated. The concentration of the processing liquid L that reaches the target temperature within a predetermined range based on a predetermined temperature is measured, thereby confirming whether the measured concentration is the target concentration. Accordingly, it is determined whether the densitometer D is normal or abnormal.

In a case where the concentration of the processing liquid L is lower than the target concentration while assuming that the target temperature is set based on the obtained boiling point temperature, the processing liquid L boils at the target temperature and the concentration of the processing liquid L settles down to the target concentration. For this reason, by measuring the concentration of the processing liquid L that reaches the target temperature with the densitometer D and comparing the concentration with the target concentration, it is possible to confirm whether the measured concentration is a correct concentration. However, when the concentration of the processing liquid L is higher than the target concentration, the processing liquid L does not boil, and even when the temperature reaches the target temperature, the concentration of the processing liquid L still remains higher than the target concentration. In this case, the processing liquid L is first diluted such that the concentration of the processing liquid L is equal to or lower than the target concentration. Then, the processing liquid L is heated again, and the concentration value is measured to determine whether the densitometer D is normal.

As described above, the processing liquid supply device 1 equipped with a self-checking function for the densitometer D. When the concentration value is within an allowable range, that is, when the densitometer D is normal, the densitometer D is continuously used. When the concentration value is out of the allowable range, that is, when the densitometer D is abnormal, appropriate processing such as outputting an alarm, cleaning the densitometer D, and/or stopping the supply of the processing liquid L may be performed.

[Processing Device]

The processing device 100 is, for example, a single-wafer type etching device in which the processing liquid L is supplied to the rotating substrate W so as to remove an unnecessary film formed on the target surface of the substrate W while leaving a circuit pattern. In the following description, an active component in the processing liquid L for the processing is referred to as a chemical liquid. Further, the concentration refers to a concentration of the chemical liquid contained in the processing liquid L. In the present embodiment, an aqueous solution containing phosphoric acid ($H_3PO_4$), which is the chemical liquid, (hereinafter, referred to as a phosphoric acid solution) is used as the processing liquid L. The phosphoric acid solution may be heated to a relatively high temperature in order to secure a processing rate, and the temperature drop of the phosphoric acid solution may be prevented. However, the processing liquid L that is used herein is not limited thereto, and for example, an acid-based liquid such as a mixed solution of hydrofluoric acid and nitric acid, and a mixed solution of acetic acid, sulfuric acid, and hydrogen peroxide (sulfuric acid hydrogen peroxide mixture: SPM) may be widely used.

The processing device 100 is a single-wafer type device that processes the substrates W one by one. The processing device 100 includes a rotation unit 101, a supply unit 102, and a recovery unit 103 all of which are configured in a chamber 100a, which is a container. The rotation unit 101 includes a rotating body 101a and a driving source 101c. The rotating body 101a is a rotating table that holds an edge of the substrate W by a holding unit 101b such as a chuck pin and rotates the substrate W around an axis perpendicular to the processed surface of the substrate W. The driving source 101c is a motor that rotates the rotating body 101a.

The supply unit 102 includes a nozzle 102a and an arm 102b. The nozzle 102a is an ejecting unit that ejects the processing liquid L toward the surface of the rotating substrate W to be processed. The nozzle 102a is provided at a tip of the arm 102b, and the arm 102b swings the nozzle between a position above the center of the rotating body 101a and a position retracted from the rotating body 101a. The nozzle 102a is connected to the processing liquid supply device 1 via a supply pipe S1 (to be described later) to supply the processing liquid L.

The recovery unit 103 is a housing that is provided to surround the rotating body 101a, and recovers the processing liquid L, which is supplied from the nozzle 102a to the surface of the rotating substrate W to be processed and is leaked from the end surface of the substrate W, from a bottom portion of the recovery unit 103. An opening is provided in the bottom portion of the recovery unit 103 and a bottom portion of the chamber 100a, and the opening is connected to the processing liquid supply device 1 via a recovery pipe R2 (to be described later).

[Processing Liquid Supply Device]

The processing liquid supply device 1 supplies the processing liquid L to the processing device 100. Further, the processing liquid supply device 1 recovers the processing liquid L used in the processing device 100, and supplies the processing liquid L to the processing device 100 together with the processing liquid L that is newly supplied. Although not illustrated in FIG. 1, a plurality of processing devices 100 is provided for a single processing liquid supply device 1.

The processing liquid supply device 1 includes a tank T, a supply path S, a heating unit H, a dilution unit I, a common flow path C, the densitometer D, and a control device E. The tank T stores the processing liquid L. The tank T may be configured with a plurality of tanks including, for example, a supply tank T, a recovery tank T2, a buffer tank T3, and a new liquid tank T4. Hereinafter, the tanks T1 to T4 are collectively referred to as the tank T when the tanks T1 to T4 are not distinguished from each other.

The supply path S connects the plurality of tanks T1 to T4 such that the processing liquid L may flow through between the plurality of tanks T1 to T4, and supplies the processing liquid L to the processing device 100 by passing through the plurality of tanks T1 to T4 sequentially. The supply path S includes supply pipes S1 to S4. The heating unit H heats the processing liquid L and includes heaters H1 to H4. Here, a configuration where the processing liquid L passes through a plurality of tanks T sequentially may refer to a configuration in which the supply path S passes through two or more tanks T among the plurality of tanks T that store the processing liquid L. That is, at least two tanks T may be connected with each other such that the processing liquid L flows through the connected tanks T.

(Supply Tank)

The supply tank T1 includes a container 10a, and stores the processing liquid L supplied to the processing device 100 in the container 10a. The container 10a is made of a material having corrosion resistance to the processing liquid L. The supply pipe S1 and a return pipe R1 are connected to the supply tank T1. The supply pipe S1 is connected to a bottom portion of the container 10a, and supplies the processing liquid L to the supply unit 102 of the processing device 100.

A pump P1, the heater H1, a filter F, and a valve V1a are provided on the path of the supply pipe S1. The pump P1 sucks the processing liquid L from a bottom portion of the supply tank T1 and sends out the processing liquid L to a target destination. The heater H1 is provided on a downstream side of the pump P1, and heats the processing liquid L sent out from the pump P1 at a predetermined target temperature. Here, in the flow of the processing liquid L from the supply tank T1 toward the processing device 100, the side of the supply tank T1 is defined as an upstream side, and the side of the processing device 100 is defined as a downstream side. A thermometer TM is provided on a downstream side of the heater H1, and a feedback from the thermometer TM is received to adjust the output of the heater HE The thermometer TM is, for example, a thermistor. The processing liquid L that is heated to the target temperature by the heater H1 is supplied to the supply unit 102 of the processing device 100.

The filter F is provided on the downstream side of the heater H1, and removes impurities from the processing liquid L flowing through the supply pipe S1. The valve V1a is provided on the downstream side of the filter F, and switches whether or not the processing liquid L is supplied to the processing device 100.

The return pipe R1 is branched at the upstream side of the valve V1a on the supply pipe S1, and is connected to the supply tank T1. A valve V1b is provided on the return pipe RE When the substrate W is not processed, the processing liquid L supplied from the supply pipe S1 to the processing device 100 is returned to the supply tank T1 via the return pipe R1 by closing the valve V1a and opening the valve V1b. That is, a circulation path is formed by the return pipe R1 and the supply pipe S1. In the circulation path, the temperature of the processing liquid L in the supply tank T1 is maintained at a predetermined temperature by the heating of the heater H1.

Further, although not illustrated, a liquid level sensor is provided in the supply tank T1 to detect a liquid level. Therefore, it is possible to detect whether an amount of the processing liquid L in the supply tank T1 is equal to or less than a predetermined amount. A heater may be provided in the container 10a of the supply tank T1 to heat the processing liquid L at a predetermined temperature.

(Recovery Tank)

The recovery tank T2 includes a container 20a, and stores the processing liquid L recovered from the processing device 100 in the container 20a. The container 20a is made of a material having corrosion resistance to the processing liquid L. The recovery pipe R2 and a supply pipe S2 are connected to the recovery tank T2. The recovery pipe R2 is configured to recover the processing liquid L from the recovery unit 103 of the processing device 100 after the etching processing.

The supply pipe S2 is connected to a bottom portion of the container 20a. A pump P2 and a heater H2 are provided on the supply pipe S2. The pump P2 sucks the processing liquid L from a bottom portion of the recovery tank T2 sends out the processing liquid L to a target destination. The heater H2 is provided on a downstream side of the pump P2, and heats the processing liquid L sent out from the pump P2 at a predetermined target temperature. Here, in the flow of the processing liquid L from the bottom portion of the recovery tank T2 toward a buffer tank T3 (to be described), an upper portion (return) of the recovery tank T2, or the common flow path C, the side of the bottom portion of the recovery tank T2 is defined as an upstream side, and the opposite side is defined as a downstream side. A thermometer TM is provided on a downstream side of the heater H2, and a feedback from the thermometer TM is received to adjust the output of the heater H2. The thermometer TM is, for example, a thermistor.

A branch point is provided in the middle of the supply pipe S2, and a path for feeding the processing liquid L to the buffer tank T3 (to be described later) and a path for returning the processing liquid L to the recovery tank T2 are branched from the branch point. Valves V2a and V2b are provided on the respective branched paths. The valve V2a switches whether or not the processing liquid L is supplied to the buffer tank T3. The valve V2b switches between the states regarding whether or not the processing liquid L is returned to the recovery tank T2.

By closing the valve V2a and opening the valve V2b, since the processing liquid L heated by the heater H2 is normally returned to the recovery tank T2, the processing liquid L is referred as being circulated. Therefore, the heater H2 heats the processing liquid L in the recovery tank T2 to the target temperature. However, when an amount of the processing liquid L in the buffer tank T3 is equal to or less than a predetermined amount and is required to be replenished, the valve V2a is opened and the valve V2b is closed so that the processing liquid L that is heated to the target temperature is supplied to the buffer tank T3. Therefore, the processing liquid L that is recovered and reheated may be used again.

Further, although not illustrated, a liquid level sensor is provided in the recovery tank T2 to detect a liquid level. Therefore, it is possible to detect whether an amount of the processing liquid L in the recovery tank T2 is equal to or less than a predetermined amount. By detecting whether the amount of the processing liquid L is equal to or less than a predetermined amount, it is possible to determine whether or not the processing liquid L is to be supplied to the buffer tank T3. That is, when an amount of the processing liquid L is equal to or less than a predetermined amount, the processing liquid L is not supplied to the buffer tank T3, and the circulation to the recovery tank T2 continues. Further, when an amount of the processing liquid L exceeds a predetermined amount, the temperature and concentration of the processing liquid L are adjusted, and then, the processing liquid L is started to be supplied to the buffer tank T3. A heater may be provided in the recovery tank T2 to heat the processing liquid L at a predetermined temperature.

(Buffer Tank)

The buffer tank T3 includes a container 30a, and stores the processing liquid L from the recovery tank T2 in the container 30a. The container 30a is made of a material having corrosion resistance to the processing liquid L. The supply pipe S3 and the supply pipe S2 are connected to the buffer tank T3.

The supply pipe S3 is connected to a bottom portion of the container 30a. A pump P3 and a heater H3 are provided on the supply pipe S3. The pump P3 sucks the processing liquid L from a bottom portion of the buffer tank T3 and sends out the processing liquid L to a target destination. The heater H3 is provided on a downstream side of the pump P3, and heats the processing liquid L sent out from the pump P3 at a predetermined target temperature. Here, in the flow of the processing liquid L from the bottom portion of the buffer tank T3 toward the supply tank T1, an upper portion (return) of the buffer tank T3, or the common flow path C, the side of the bottom portion of the buffer tank T3 is defined as an upstream side, and the opposite side is defined as a downstream side. A thermometer TM is provided on a downstream side of the heater H3, and a feedback from the thermometer TM is received to adjust the output of the heater H3. The thermometer TM is, for example, a thermistor.

A branch point is provided in the middle of the supply pipe S3, and a path for feeding the liquid to the supply tank T1 and a path for returning to the buffer tank T3 are branched from the branch point. Valves V3a and V3b are provided on the respective branched paths. The valve V3a switches between the states regarding whether or not the processing liquid L is supplied to the supply tank T1. The valve V3b switches between the states whether or not the processing liquid L is returned to the buffer tank T3.

By closing the valve V3a and opening the valve V3b, since the processing liquid L heated by the heater H3 is normally returned to the buffer tank T3, the processing liquid L is referred as being circulated. Therefore, the heater H3 heats the processing liquid L in the buffer tank T3 to the target temperature. However, when an amount of the processing liquid L in the supply tank T1 is equal to or less than a predetermined amount and is required to be replenished, the valve V3a is opened and the valve V3b is closed so that the processing liquid L that is heated to the target temperature is supplied to the buffer tank T1.

Further, although not illustrated, a liquid level sensor is provided in the buffer tank T3 to detect a liquid level. Therefore, it is possible to detect whether an amount of the processing liquid L in the buffer tank T3 is equal to or less than a predetermined amount. By detecting whether an amount of the processing liquid L is equal to or less than a predetermined amount, it is possible to determine whether the processing liquid L is to be supplied from the recovery tank T2. That is, when an amount of the processing liquid L is equal to or less than a predetermined amount, the processing liquid L is supplied from the recovery tank T2, and the processing liquid L is not supplied to the supply tank T1 and is continuously circulated to the buffer tank T3. Further, when an amount of the processing liquid L exceeds a predetermined amount, the processing liquid L is not supplied from the recovery tank T2, and the temperature and concentration of the processing liquid L are adjusted to the respective target values, that is, the target temperature and target concentration, and then, the processing liquid L is started to be supplied to the supply tank T1. A heater may be provided in the buffer tank T3 to heat the processing liquid L at a predetermined temperature.

Further, the pipes each provided with a valve Vz are connected to the bottom portions of the supply tank T1, recovery tank T2, and buffer tank T3, and are joined to a discharge path Z, which is a common pipe. The discharge path Z is connected to a waste liquid path of the factory.

(New Liquid Tank)

The new liquid tank T4 includes a container 40a, and stores the processing liquid L that is newly prepared (hereinafter, referred to as a new liquid) in the container 40a. The container 40a is made of a material having corrosion resistance to the processing liquid L. A liquid feeding pipe R3 and the supply pipe S4 are connected to the new liquid tank T4. The liquid feeding pipe R3 supplies the processing liquid L from a supply source of the processing liquid L (not illustrated) to the new liquid tank T4.

The supply pipe S4 is connected to a bottom portion of the container 40a. A pump P4 and a heater H4 are provided on the supply pipe S4. The pump P4 sucks the processing liquid L from a bottom portion of the new liquid tank T4 sends out the processing liquid L to a target destination. The heater H4 is provided on a downstream side of the pump P4, and heats the processing liquid L sent out from the pump P4 at a predetermined target temperature. Here, in the flow from the bottom portion of the new liquid tank T4 toward the recovery tank T2, the buffer tank T3, the supply tank T1, an upper portion (return) of the new liquid tank T4, or the common flow path C, the side of the bottom portion of the new liquid tank T4 is defined as an upstream side, and the opposite side is defined as a downstream side. A thermometer TM is provided on a downstream side of the heater H4, and a feedback from the thermometer TM is received to adjust the output of the heater H4. The thermometer TM is, for example, a thermistor.

The supply pipe S4 is branched into a liquid feeding path for feeding the liquid to the recovery tank T2, the buffer tank T3, and the supply tank T1 and a path for returning to the new liquid tank T4. The liquid feeding path is branched to the recovery tank T2, the buffer tank T3, and the supply tank T1, and is provided with valves V4a, V4c, and V4d, respectively. The valves V4a, V4c, and V4d switch between the states regarding whether or not the processing liquid L is sent to the recovery tank T2, the buffer tank T3, and the buffer tank T3, respectively. The liquid feeding path and the valves V4a, V4c, and V4d constitute a new liquid supply unit J that supplies the new liquid to at least one of the recovery tank T2, the buffer tank T3, and the supply tank T1. A valve V4b is provided on the path returning to the new liquid tank T4. The valve V4b switches between the states regarding whether or not the processing liquid L is returned to the new liquid tank T4.

By closing the valve V4a, the valve V4c, and the valve V4d and opening the valve V4b, since the processing liquid L heated by the heater H4 is normally returned to the new liquid tank T4, the processing liquid L is referred as being circulated. Therefore, the heater H4 heats the processing liquid L in the new liquid tank T4 to the target temperature. Further, when the new liquid becomes usable as the processing liquid L, and an amount of the processing liquid L in the supply tank T1 is equal to or less than a predetermined amount and the processing liquid L in the buffer tank T3 is equal to or less than a predetermined amount as well, the valve V4b is closed and the valve V4d is opened so that a predetermined amount of the processing liquid L is sent to the supply tank T1. Therefore, the processing liquid L that is insufficient even with the supply from the buffer tank T3, due to the supply to the processing device 100 and the use for the processing is replenished. The new liquid is supplied from the new liquid tank T4 to the recovery tank T2 by closing the valve V4b and opening the valve V4a. However, the new liquid is supplied to the recovery tank T2 only when the amount of the processing liquid L in the recovery tank T2 is equal to or less than a predetermined amount and the recovered liquid does not flow in from the processing device 100 continuously, so that the recovery tank T2 does not overflow with the combined flow of the recovered liquid and the new liquid.

The new liquid tank T4, that has replenished the processing liquid L for the supply tank T1, is added with the new liquid from the liquid feeding pipe R3 by the replenished amount, and the subsequent heating is performed. The new liquid is replenished to the buffer tank T3 by opening the valve V4c when an amount of the processing liquid L in the buffer tank T3 is equal to or less than a predetermined amount and the supply from the recovery tank T2 is insufficient.

Further, although not illustrated, a liquid level sensor is provided in the new liquid tank T4 to detect the liquid level of the processing liquid L. Therefore, it is possible to detect whether an amount of the processing liquid L in the new liquid tank T4 is equal to or less than a predetermined amount, and to determine whether or not the new liquid tank T4 is to be replenished by feeding the liquid from the liquid feeding pipe R3. A heater may be provided in the new liquid tank T4 to heat the processing liquid L at a predetermined temperature.

(Dilution Unit)

The dilution unit I dilutes the processing liquid L with the diluent. The diluent is a liquid that decreases the concentration of the liquid in the tank T, and may be pure water in the present embodiment. The dilution unit I includes a liquid feeding pipe R4. The liquid feeding pipe R4 is branched from a supply source of pure water (not illustrated) into the supply tank T1, the recovery tank T2, the buffer tank T3, and the new liquid tank T4 to supply the diluent to each of the tanks T1 to T4. A valve V5 is provided in each of the branched pipes to each of the tanks T1 to T4. A predetermined amount of pure water is added to each of the tanks T1 to T4 based on the concentration measurement of the processing liquid L in each of the tanks T1 to T4 by the densitometer D (to be described later).

(Common Flow Path)

The common flow path C is a common path through which the processing liquid L in the plurality of tanks T1 to T4 flows. The common flow path C in the present embodiment is a pipe to which pipes t1 to t4 branched from the supply pipes S1 to S4 are joined. That is, the branch point is provided on the downstream side of the filter F of the supply pipe S1, and the pipe t1 is branched from the branch point. The pipe t2 is branched from the branch point in the supply pipe S2 to the buffer tank T3 and the recovery tank T2. The pipe t3 is branched from the branch point in the supply pipe S3 to the supply tank T1 and the buffer tank T3. Further, the pipe t4 is branched from the branch point in the supply pipe S4 to the supply tank T1 or the like and the new liquid tank T4. A valve V6a is provided on each of the pipes t1 to t4 from the supply pipes S1 to S4. Further, the common flow path C is connected to pipes bp1 to bp4 that are branched to and returned to the plurality of tanks T1 to T4. A valve V6b is provided on each of the pipes bp1 to bp4 branched from the common flow path C and directed to the plurality of tanks T1 to T4. The valves V6a and V6b constitute the switching unit SW that switches the processing liquid L to be flowing to the common flow path C among the processing liquid L in the tanks T1 to T4 depending on which valve is opened. That is, the switching unit SW switches between the states regarding which of the processing liquid L in the tanks T1 to T4 is to be flowing through the common flow path C.

(Densitometer)

The densitometer D is provided on the common flow path C, and measures the concentration of the processing liquid L flowing through the common flow path C. The processing liquid L is sent to the densitometer D and is returned to the tank T by switching the valves V6a and V6b of the switching unit SW so as to be distinguished from the tanks T1 to T4 and so as not to be mixed between the tanks T1 to T4. That is, the processing liquid L come out from the same tank T is returned to the same tank T so as not to mixed with the processing liquid L from the other tank T stayed at least in the common flow path C. One densitometer D of the present embodiment is provided on the common flow path C. An optical type densitometer D, which is relatively highly accurate, may be used.

A cleaning liquid supply circuit K that is configured to clean the inside of the densitometer D is connected to the common flow path C. The cleaning liquid supply circuit K includes a pipe and a valve Vk1 that supply the diluent from the dilution unit I to the common flow path C to clean the inside of the densitometer D. Further, a pipe is directly connected to the common flow path C to discharge the diluent supplied from the cleaning liquid supply circuit K and used to clean the densitometer D to the discharge path Z. A valve Vkw is provided on the pipe.

(Barometer)

The barometer B is installed in an ancillary area, which is a processing chamber that is a housing in which the processing liquid supply device 1 is accommodated, and in which the control device E is disposed. However, the location at which the barometer B is provided is not limited thereto. That is, since it is sufficient to measure the atmospheric pressure of the place where the processing liquid supply device 1 is provided, the place where the barometer B is provided may be outside the processing liquid supply device 1, indoor or a floor where the processing liquid supply device 1 is provided.

(Control Device)

The control device E controls each component of the substrate processing apparatus SS. The control device E includes a processor that executes a program, a memory that stores the program or various information such as an operation condition, and a driving circuit that drives each element in order to implement various functions of the substrate processing apparatus SS. The control device E is connected with an input unit Ei that inputs information and an output unit Eo that outputs information. The input unit Ei is an input device such as a touch panel, a keyboard, or a switch. The output unit Eo is an output device such as a display, a lamp, a speaker, or a buzzer.

The control device E includes a substrate processing control unit 21, a concentration control unit 22, an inspecting unit 23, a cleaning processing unit 24, and a storage unit 25. The substrate processing controller 21 executes the processing of the substrate W by controlling each component of the processing device 100 and the processing liquid supply device 1. That is, the substrate processing control unit 21 controls, for example, the carry-in/out of the substrate W with respect to the chamber 100a, the holding of the substrate W by the holding unit 101b, the rotation of the rotating body 101a by the driving source 12, the swing of the nozzle 102a by the arm 102b, the determination of the supply of the processing liquid L by switching the valves V1a and V1b, and the replenishment of the processing liquid L to each of the tanks T1 to T4 by switching the valves V2a, V2b, V3a, V3b, V4a, and V4b.

The concentration control unit 22 causes the densitometer D to measure the concentration of the processing liquid L in each of the tanks T1 to T4, and controls the heating unit H and the dilution unit I so that the concentration of the processing liquid L reaches a predetermined target value (e.g., a target concentration). The target concentration is a predetermined range around the set concentration including the set concentration. The set concentration is, for example, 87.7%. In the concentration control, as described above, the temperature of the processing liquid L is controlled so as to be a predetermined target value (e.g. a target temperature) as well. The target temperature is a predetermined range around the set temperature including the set temperature. The set temperature is, for example, 160° C. The concentration control unit 22 controls the heating unit H and the dilution unit I by calculating the heating amount and the added amount of the diluent, based on one of or both of the difference between the measured value and the target value (e.g., target concentration and target temperature) and the amount of the change in the measured value. When calculating the difference between the measured value and the target value, the set concentration and the set temperature are used. However, the set concentration and set temperature may not be controlled to coincide, and it is sufficient to control the set concentration and set temperature so as to be within the ranges of the target concentration and target temperature.

More specifically, the concentration control unit 22 switches the opening/closing of the valves V6a and V6b of the switching unit SW to switch among the tanks T1 to T4 where the concentration is to be measured. The switching of the tanks T1 to T4 is performed at predetermined time intervals set for each of the tanks T1 to T4. Further, the concentration control unit 22 performs a concentration process by heating the processing liquid L and a dilution process by adding pure water based on the switching of the output of the heaters H1 to H4, which is the heating unit H, and the opening/closing of the valve 5 of the dilution unit I.

By setting the time intervals, the measurement time of the tanks T may be set to be the same for all tanks T, or the measurement time may be set to be different from each tank T. For example, the measurement time for a specific tank T may be set to be longer than other tanks. However, when the measurement time is set to be the same, the frequency of the measurement may be increased, instead of securing a relatively long measurement time for one time. Therefore, since the concentration of the processing liquid L in each of a plurality of tanks T may be measured and adjusted within a predetermined time, the concentrations of the processing liquid L in all tanks T may easily converge to the target value.

The inspecting unit 23 includes a temperature setting unit 231, a heating control unit 232, and a determination unit 233. The temperature setting unit 231 sets the boiling point temperature at which the processing liquid L reaches a predetermined concentration as a predetermined temperature (e.g., a set temperature), based on the atmospheric pressure at the place where the processing liquid supply device 1 is provided and the preset vapor pressure curve of the processing liquid L. The atmospheric pressure at the place where the processing liquid supply device 1 is provided is acquired from the barometer B connected to the control device E. The heating control unit 232 heats the processing liquid L by the heater H to reach the target temperature within a predetermined range based on the set temperature. The determination unit 233 determines whether or not the concentration of the processing liquid L that is measured by the densitometer D and reaches the target temperature is within a predetermined range based on a predetermined concentration (e.g., a set concentration), that is, determines whether the concentration of the processing liquid L is the target concentration.

When the determination unit 233 determines that the concentration is not the target concentration but is higher than the target concentration, the heating control unit 232 supplies the diluent from the dilution unit I so that the processing liquid L has a concentration lower than the target concentration and a temperature lower than the target temperature. The heating control unit 232 then causes the heating unit H to heat the processing liquid L again to reach the target temperature. The determination unit 233 determines whether or not the concentration of the processing liquid L that reaches the target temperature is the target concentration based on the measurement result by the densitometer D.

When the determination unit 233 determines that the concentration is not the target concentration but is lower than the target concentration, or determines that, after being determined that the concentration is higher than the target concentration, the concentration after the dilution and reheating is not the target concentration, the output unit Eo outputs information that notifies that the concentration is not the target concentration. For example, a display device of the output unit Eo may display information indicating that the densitometer D is not normal, or the lamp may notify that the densitometer D is not normal by lighting or flashing the lamp. Further, the speaker of the output unit Eo may output sound notifying that the densitometer D is not normal, or the alarm by the buzzer may notify that the densitometer D is not normal.

The vapor pressure curve may be obtained by measuring the temperature and air pressure when the processing liquid L is boiled to reach the target concentration at the place where the processing liquid supply device 1 is provided, and measuring the boiling point temperature when the air pressure is changed between the low pressure and the high pressure. Since there may be a difference between the air pressure in the tank T and the atmospheric pressure due to the configuration of the processing liquid supply device 1, an evaluation may be performed with the same device configuration. The vapor pressure curve may be set with the calculation by the control device E, or by an input from the input unit Ei.

Figure 2:
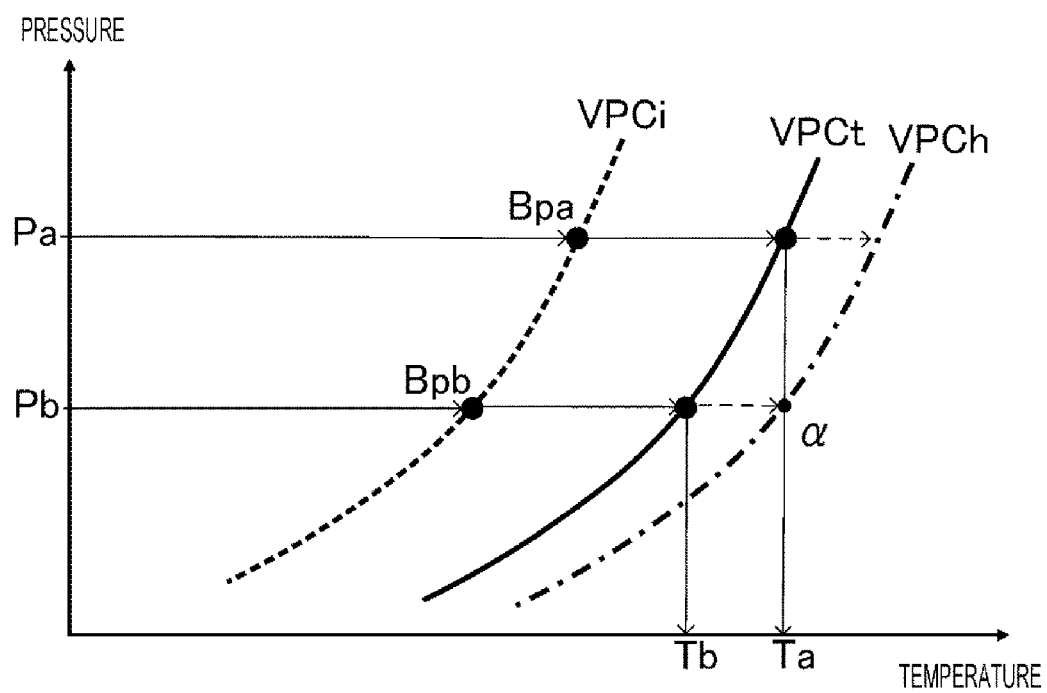
FIG. 2 is a graph illustrating transition of a vapor pressure curve of a processing liquid in the processing liquid supply device of the embodiment.

Here, FIG. 2 illustrates an example of the vapor pressure curve in a state where the processing liquid L is heated to be boiled in the atmosphere. In FIG. 2, a vapor pressure curve VPCi for the initial concentration is illustrated by a dotted line, a vapor pressure curve VPCt for the target concentration is illustrated by a solid line, and a vapor pressure curve VPCh for the liquid having a concentration higher than the target concentration is illustrated by a single dotted line. As will be described later, FIG. 2 illustrates a behavior of the concentration change in the processing liquid L in which the concentration is changed by replenishing the new liquid tank T4 with the new liquid having a concentration lower than the target concentration, and then, by heating and boiling the processing liquid L. That is, it is an example of an adjusting of concentration in which the concentration is adjusted by using the heating path of the new liquid tank T4 of the processing liquid supply device 1 as illustrated in FIG. 1. However, the behavior of the change in the vapor pressure curves VPCi, VPCt, and VPCh, the temperature, and the concentration illustrated here is common with the general behavior of the processing liquid L, and thus, descriptions will be made with reference to FIG. 2.

The boiling point of the liquid moves along the vapor pressure curve when the atmospheric pressure is changed. For this reason, when the apparatus is provided at a position with a relatively high altitude, or in a case where a low pressure passes the place where the device is provided due to, for example, a typhoon, a phenomenon in which the boiling point is decreased occurs. That is, as illustrated by the vapor pressure curve VPCi in FIG. 2, when the air pressure Pa is relatively high, a boiling point Bpa becomes relatively high, and when the air pressure Pb is relatively low, a boiling point Bpb is decreased. As described above, the change in the boiling point according to the air pressure refers that, when the processing liquid L having a predetermined concentration is heated, the boiling begins relatively quickly when the air pressure is relatively low, and the boiling begins relatively slowly when the air pressure is relatively high. The boiling point at which the processing liquid L boils is determined depending on the concentration of the processing liquid L and the air pressure. Therefore, even when the target temperature is determined in advance, the concentration of the processing liquid L is changed due to the change in the air pressure, and does not remain constant. That is, when the boiling point is changed, the boiling temperature is changed as well and the amount of water that evaporates is changed, and thus, even when the temperature of the processing liquid L is set to the same temperature (e.g., a target temperature), the concentration of the boiled processing liquid L may be changed.

The present inventors focused on such a vapor pressure curve to obtain a method that determines whether or not the densitometer D is normal. Then, as a result of a close study, the inventors found out the method in the following. That is, the vapor pressure curve VPCt is obtained for the set concentration for the processing liquid L to be used. Further, the boiling point temperature according to the change in the atmospheric pressure (e.g., a change in the vapor pressure) is obtained from the vapor pressure curve VPCt. For example, the boiling point temperature Ta at the time of the air pressure Pa, and a boiling point temperature Tb at the time of the air pressure Pb are obtained. Further, the concentrations of the processing liquid L that reach the boiling points Ta and Tb by heating the processing liquid L are measured by the densitometer D, and it is determined whether or not the measured values are the target concentration within a predetermined range based on the set concentration. Therefore, it becomes possible to determine whether or not the densitometer D is normal.

When the determination unit 233 determines that the measured values of the concentration of the processing liquid L are not the target concentration, the cleaning processing unit 24 performs the cleaning processing of the densitometer D. The cleaning processing unit 24 performs the cleaning by flowing the diluent through the densitometer D by controlling the valves Vk1 and Vk2 of the cleaning liquid supply circuit K. That is, by opening the valves Vk1 and Vk2, the cleaning processing unit 24 switches to supply the diluent from the cleaning liquid supply circuit K to the common flow path C to clean the densitometer D and to be discharged to the discharge path Z. Further, when the concentration of the processing liquid L in each tank T is measured, an operation for replacing the processing liquid L in the common flow path C with the processing liquid L to be measured in the concentration. That is, the concentration is measured after the processing liquid L from the tank T to be measured in the concentration flows through the common flow path C for a predetermined period. As described above, the first predetermined time of the liquid flow from each tank T to the densitometer D is a processing for replacing the previous processing liquid L. Therefore, by opening the valve Vk2 without returning the processing liquid L to the tank T, the processing liquid L directly flows from the common flow path C to the discharge path Z. In this case, a configuration may be used in which the processing liquid L may be drained without passing through the tank T by providing a flow path through which the processing liquid L directly flows from the common flow path C to the discharge path Z.

The storage unit 25 is configured as a memory, and stores the target concentration, target temperature, time interval, and vapor pressure curve. For the target concentration, target temperature, and time interval, a desired value may be input by an operator by using the input unit Ei. For example, for the recovery tank T2 that recovers the processing liquid L in which the concentration and temperature are largely varied to be used for the processing, the concentration may be adjusted by increasing the frequency of the measurement compared to the other tanks T and lengthening the measurement time. Further, the processing of the substrate W may be stabilized by increasing the frequency of the measurement of the supply tank T1 compared to the other tanks T, which directly affects the processing of the substrate W. The target concentration and target temperature may be set by combining a predetermined concentration and a predetermined temperature, and an allowable predetermined range.

[Operation]

The operation of the substrate processing apparatus SS of the present embodiment as described above will be described with reference to FIGS. 3 and 4, in addition to FIGS. 1 and 2. A substrate processing method that processes the substrate W according to the following procedure is one aspect of the present embodiment as well.

(Substrate Processing)

First, the substrate processing by the processing device 100 will be described. First, the substrate W, which is a processing target, is carried onto the rotating body 101a by a transfer robot, and is held by the supporting unit 101b. The substrate W is rotated by rotating the rotating body 101a by the driving source 101c. The processing liquid L that reaches a desired concentration and temperature by the processing liquid supply device 1 is supplied from the nozzle 102a to the target surface of the substrate W by opening the valve V1a, thereby performing an etching processing.

After a predetermined processing time has elapsed, the valve V1a is closed and the supply of the processing liquid L is stopped. Thereafter, the rotation of the substrate W is stopped, and the substrate W released from the supporting unit 101b is carried out from the chamber 100a by the transfer robot.

(Supply of Processing Liquid)

Subsequently, an adjustment processing of the processing liquid L by the processing liquid supply device 1 will be described. The processing liquid L in the supply tank T1 is maintained at the target temperature before being supplied to the processing device 100, by being heated by the heater H1 while circulating the supply pipe S1, returning pipe R1, and supply tank T1 in a state where the valve V1a is closed and the valve V1b is opened. Then, as described above, the processing liquid L in the supply tank T1 is supplied to the processing device 100 at a processing timing of the processing device 100.

The temperature of the processing liquid L in the buffer tank T3 is maintained at the target temperature before being supplied to the supply tank T1, by being heated by the heater H3 while circulating the supply pipe S3 and buffer tank T3 in a state where the valve V3a is closed and the valve V3b is opened. Then, when the amount of the processing liquid L in the supply tank T1 is equal to or less than a certain amount, the processing liquid L is supplied to the supply tank T1 by opening the valve V3a and closing the valve V3b.

The processing liquid L in the recovery tank T2 is maintained at the target temperature before being supplied to the buffer tank T3, by being heated by the heater H2 while circulating the supply pipe S2 and recovery tank T2 in a state where the valve V2a is closed and the valve V2b is opened. Then, when an amount of the processing liquid L in the buffer tank T3 is equal to or less than a certain amount, the processing liquid L is supplied to the buffer tank T3 by opening the valve V2a and closing the valve V2b.

The processing liquid L in the new liquid tank T4 is maintained at the target temperature before being supplied to the recovery tank T2, buffer tank T3, and supply tank T1 by being heated with the heater H4 while circulating the supply pipe S4 and new liquid tank T4 in a state where the valves V4a, V4c, and V4d are closed and the valve V4b is opened. Then, when the liquid amount of the processing liquid L in the buffer tank T3 falls below a predetermined amount and the processing liquid L cannot be supplied to the supply tank T1, and further, when the liquid amount of the supply tank T1 falls below a predetermined amount as well, the new liquid is supplied from the new liquid tank T4 to the supply tank T1 by opening the valve V4d and closing the valve V4b. Similarly, for the recovery tank T2 and the buffer tank T3 as well, when the supply is insufficient and the amount of the processing liquid L is equal to or less than a predetermined amount, the new liquid may be supplied to the recovery tank T2 and the buffer tank T3 by opening the valves V4a and V4c.

(Concentration Control)

Descriptions will be made on the concentration control performed during the procedure in which the processing liquid L is supplied to the processing device 100 by sequentially passing the processing liquid L through each of the tanks T1 to T4 as described above. First, as described above, the concentration measurement is performed by measuring the concentration with the densitometer D by switching the processing liquid L of the tanks T1 to T4 flowing through the common flow path C by sequentially switching the opening of the valve corresponding to any one of each set of t1-T1, t2-T2, t3-T3, and t4-T4 in the valves V6a and V6b of the switching unit SW and the closing of the others at predetermined time intervals.

The concentration of the processing liquid L is measured in each of the tanks T1 to T4 after the processing liquid L from any one of the tanks T for which the concentration is to be measured flows through the common flow path C for a certain period to replace the previous processing liquid L. Therefore, it becomes possible to selectively flow the processing liquid L through the common flow path C from the tanks T1 to T4, and thus, the concentration of the processing liquid L in each of the tanks T1 to T4 may be measured by a single densitometer D at predetermined time intervals.

When the processing liquid L needs to be concentrated, the output of the heaters H1 to H4 of the corresponding tanks T1 to T4 is increased depending on the difference between the measured concentration and the target concentration. When the processing liquid L needs to be diluted, the valve V5 on the pipe of the dilution unit I leading to the corresponding tanks T1 to T4 is opened to add pure water by a predetermined amount.

As described above, the concentration of the processing liquid L in each of the tanks T1 to T4 may be adjusted by using the densitometer D. The concentration adjustment is to stabilize the concentration of the processing liquid L at the target concentration in the supply tank T1 that supplies the processing liquid L to the processing device 100. Among the tanks T1 to T4, the temperature and concentration of the processing liquid L in the recovery tank T2 are relatively largely varied due to the inflow of the recovered processing liquid L. For this reason, the target concentration may not be matched in the recovery tank T2 at the time of feeding the liquid to the buffer tank T3. Therefore, in the buffer tank T3, even though the processing liquid L flows therein from the recovery tank T2, the processing liquid L is sent with a small amount of variation in the temperature or concentration when feeding to the supply tank T1. For this reason, the concentration may be controlled based on the concentration measurement by the densitometer D. If such control is efficiently performed in a relatively short time period, a step by step adjustment of the tanks T1 to T4 may be omitted.

Further, when the new liquid tank T4 is replenished with the new liquid at the room temperature, the concentration and temperature of the processing liquid L that has been adjusted to the target concentration and target temperature are changed due to the replenished new liquid. For example, the temperature is changed to a temperature side lower than the target temperature, and the concentration is changed to the concentration side of the replenished new liquid. The temperature of the processing liquid L in the new liquid tank T4 may be restored by setting the temperature of the outlet of the heater H4 to the set temperature that makes the temperature of the processing liquid L to reach the target temperature. Meanwhile, an available adjustment method of the concentration is changed according to the concentration of the replenished processing liquid L.

The processing liquid L used in the processing of the substrate W is often used by adjusting the concentration by mixing a chemical liquid having a relatively high concentration with pure water. However, in the processing liquid L, which has the highest etching rate when used at the boiling point of the solution, such as a phosphoric acid solution, since it is necessary to be adjusted around the boiling point, the processing liquid L at the room temperature is boiled to increase the concentration, thereby adjusting the concentration. The concentration of such a processing liquid L is mainly adjusted by heating such that the concentration increases from the low concentration to the high concentration.

In the meantime, once the concentration of the processing liquid L with the temperature adjusted by heating becomes higher than the target concentration, the concentration of the processing liquid L does not decrease even when only the temperature of the processing liquid L is decreased by heat radiation from the surface of the new liquid tank T4. In order to decrease the concentration, it is necessary to decrease the concentration of the entire processing liquid L in the new liquid tank T4 by adding the diluent or mixing with a new liquid having a relatively low concentration. In this case, since the temperature is lowered as well, in order to adjust both the concentration and temperature to the target concentration and target temperature, the added amount is calculated from the concentration and temperature of the mixed liquid. However, it is difficult to obtain a solution that adjusts the temperature to the target temperature at the same time with the added amount to adjust the concentration to the target concentration. Therefore, the temperature of the processing liquid L is decreased first by adding the diluent or the new liquid that adjusts the concentration to the target concentration, and then, the temperature of the processing liquid L is adjusted to the target value by heating.

(Densitometer Inspection)

Figure 3:
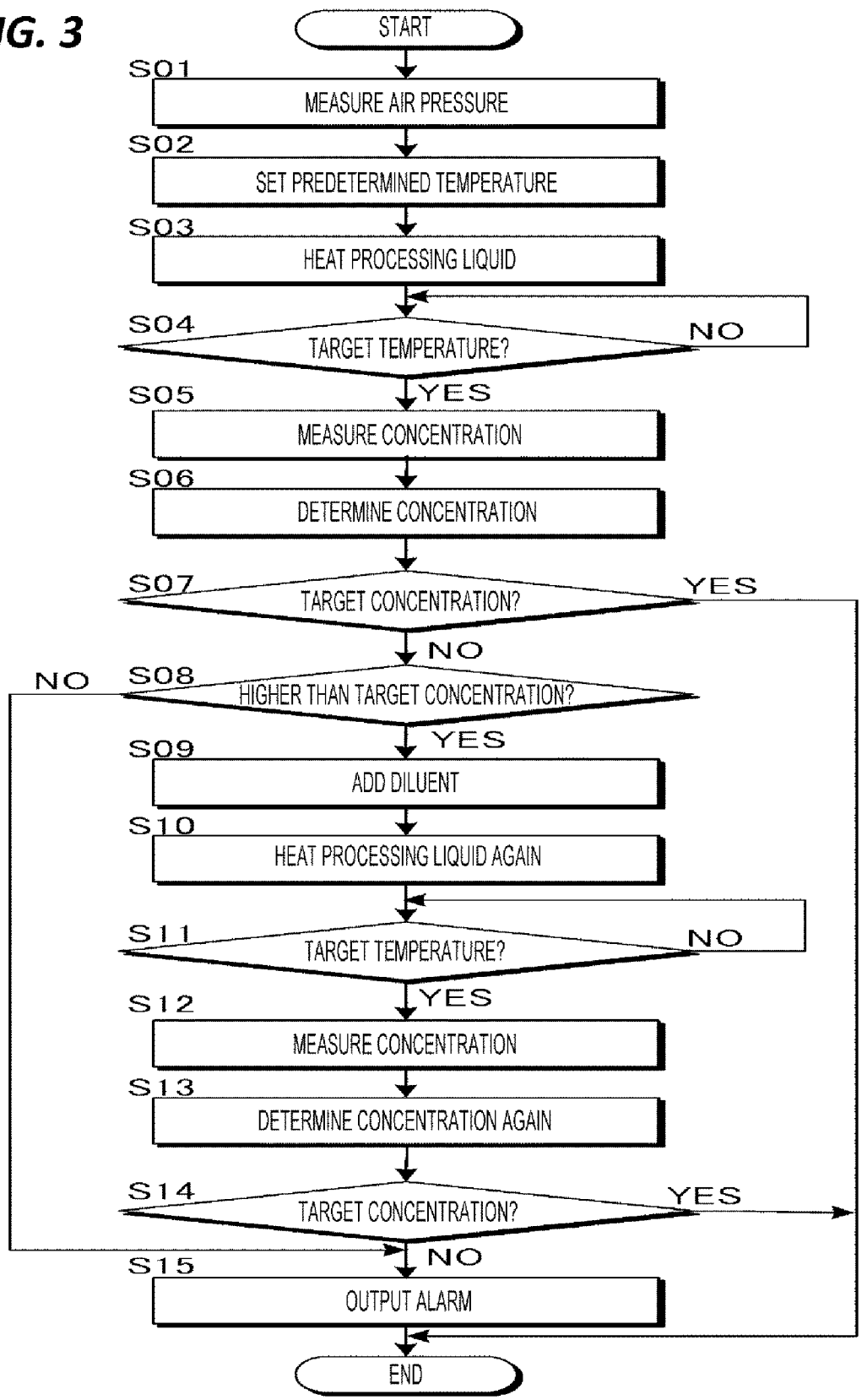
FIG. 3 is a flowchart illustrating an inspection procedure of a densitometer by the processing liquid supply device of the embodiment.

Subsequently, an inspection procedure of the densitometer D will be described with reference to the flowchart in FIG. 3. First, the inspecting unit 23 of the control device E acquires the atmospheric pressure at the place where the processing liquid supply device 1 is provided by the barometer B (step S01). The temperature setting unit 231 sets the boiling point temperature, which is the set concentration, as a predetermined temperature (e.g. a set temperature) based on the acquired atmospheric pressure, and the preset vapor pressure curve (e.g., vapor pressure curve for the set temperature) of the processing liquid L (step S02). The heating control unit 232 heats the processing liquid L by the heating unit H (step S03). When it is determined from the measured value of the thermometer TM that the processing liquid L reaches the target temperature (YES in step S04), the concentration of the processing liquid L is measured by flowing the processing liquid L into the densitometer D (step S05). Even in the concentration measurement for inspecting the densitometer D, the processing liquid L from the tank T is allowed to pass the densitometer D in advance for a predetermined period, thereby replacing the previous processing liquid L.

The determination unit 233 determines whether or not the concentration of the processing liquid L measured by the densitometer D is the target concentration (step S06). When it is determined that the concentration reaches the target concentration (YES in step S07), the inspection is ended and the processing of the substrate W is continued. When it is determined that the concentration is not the target concentration (No in step S07) and is lower than the target concentration (No in step S08), the output unit Eo outputs information that notifies that the concentration is not the target concentration and is lower than the target concentration (step S15).

When it is determined that the concentration is not the target concentration (No in step S07), and is higher than the target concentration (YES in step S08), the concentration value is decreased below the target concentration and the temperature is lowered below the target temperature by adding the diluent (step S09). Then, the heating control unit 232 heats the processing liquid L again by the heating unit H (step S10), and, when it is determined that the temperature reaches the target temperature (YES in step S11), measures the concentration of the processing liquid L by the densitometer D (step S12). The determination unit 233 determines again whether or not the concentration of the processing liquid L measured by the densitometer D is the target concentration (step S13). When it is determined that the concentration reaches the target concentration (YES in step S14), the inspection is ended and the processing of the substrate W is continued. When it is determined that the concentration is not the target concentration (No in step S14), the output unit Eo outputs information that notifies that the concentration is not the target concentration (step S15).

When the change in the boiling point temperature is calculated by measuring the atmospheric pressure as described above, and the temperature of the processing liquid L in the tank T is raised to the boiling point temperature, the concentration of the processing liquid L may be controlled to be the target concentration. As described above, the concentration and temperature may be adjusted to the target concentration and target temperature in the new liquid tank T4, which does not replenish the other tanks T1 to T3 until the processing liquid L is prepared. After the low-concentration new liquid is replenished, the concentration may be adjusted to the target concentration by raising the temperature to the target temperature, which reaches the target concentration, by heating.

Figure 4:
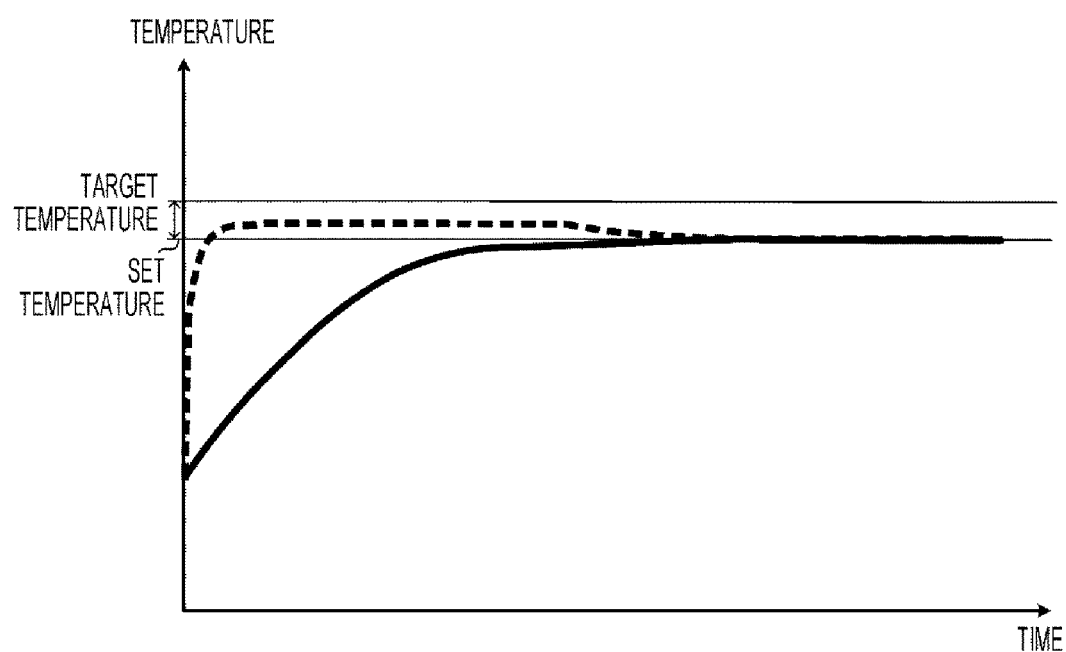
FIG. 4 is a graph illustrating concentration control in the processing liquid supply device of the embodiment.

FIG. 4 illustrates the temperature changes over time in the temperature of the processing liquid L in the new liquid tank T4 (solid line) and the temperature of the processing liquid L, which is heated by the heater H4, at the outlet of the heater H4 (dotted line). As illustrated in the solid line in FIG. 4, when the processing liquid L in the new liquid tank T4 having the lowered concentration and temperature is heated by the heating unit H in the circulation path, that is, heated by the in-line heater H4, the concentration and temperature of the processing liquid L becomes gradually close to the target concentration and target temperature due to the processing liquid L returned to the new liquid tank T4. In the heating by the in-line heater H4, as illustrated in the dotted line in FIG. 4, the outlet temperature of the heater H4 is set to a temperature slightly higher than the set temperature. Therefore, when the processing liquid L heated by the heater H4 is returned to the new liquid tank T4, the temperature of the processing liquid L in the new liquid tank T4 may be quickly increased. That is, the temperature of the processing liquid L is raised with the lapse of time, and the temperature and concentration of the processing liquid L in the new liquid tank T4 may be close to the target temperature and target concentration. The temperature may be set to a temperature that can maintain the temperature of the new liquid tank T4 at the target temperature, by controlling the added amount of the diluent using the densitometer D.

In the in-line heater H4, since the processing liquid L is boiled and returned to the new liquid tank T4, the generated water vapor is released from the surface of the new liquid tank T4. The boiling temperature at this time is the boiling point temperature changed in the atmospheric pressure, and the concentration is the target concentration. When setting the temperature to be slightly higher, it is possible to be quickly close to the target concentration by mixing with the processing liquid L in the new liquid tank T4 having a low concentration. By heating the path through which the processing liquid L is circulating, the temperature of the processing liquid L in the new liquid tank T4 is gradually raised to be close to the target temperature. In this case, the difference between the temperature of the processing liquid L sucked from the path through which the processing liquid L is circulating and the set temperature of the heater H4 becomes small, and the heating amount of the heater H4 becomes small.

In this state, the boiling of the processing liquid L by the heater H4 is extremely small, and the outlet temperature of the heater H4 is stabilized as well. Even when the densitometer D measures the processing liquid L in this state, the measured concentration value is stabilized. The concentration value is a preset concentration at the boiling point, and is the target concentration. For this reason, as described above, it is possible to check whether or not the densitometer D is functioning normally, by confirming whether or not the concentration value of the densitometer D indicates the target concentration.

For more stable measurement, the checking on the densitometer K should be performed after the boiling subsides. Therefore, the indicated value of the densitometer D may be somewhat higher than the target concentration. In this case, the concentration of the processing liquid L is measured by using another method, and the difference from the target concentration is obtained, and then, the difference is used as an offset value for the next time. Therefore, it is possible to determine whether or not the densitometer D is normal with a higher accuracy. As another method, for example, a method in which the concentration is confirmed by sampling the processing liquid L and measuring the specific gravity may be used.

When it is possible to determine whether or not the function of the densitometer D is normal by heating and boiling the processing liquid L in the new liquid tank T4, the risk of controlling the concentration of the other tanks T1 to T3 using the densitometer D may be eliminated. Moreover, the processing liquid L is replenished in the new liquid tank T4 according to the number of substrates processed in the processing device 100, and thus, the function of the densitometer D may be confirmed at regular processing intervals. When the processing frequency is relatively high, the setting may be changed to a certain time interval.

When it is determined that the densitometer D is not normal, an alarm is output as described above. Further, the following processing may be performed. For example, since the densitometer D is normal in the previous replenishment of the new liquid, it may be determined that the apparatus is not at a level that is required to stop immediately, and the processing of the substrate W may be continued until the supply tank T1 is emptied.

During the period, it may be confirmed again whether or not the densitometer D may be reset by cleaning the densitometer D. When the cleaning processing unit 24 performs the cleaning of the densitometer D, and it is confirmed again that the concentration value is within the allowable range, the densitometer D becomes usable. In the densitometer D, the concentration value is changed from the normal value mainly due to the adhesion of the contaminants to the processing liquid L, and thus, the resetting by the cleaning is effective. Even after the cleaning, when the measured concentration value is out of the allowable range, the output unit Eo may output an alarm allowing the operator to make a determination on an appropriate action. Further, when the concentration value is out of the allowable range, and the amount of deviation is substantially large, the processing liquid supply device 1 may be stopped.

More specifically, descriptions will be made on a processing in which a nitride film of the wafer, which is the substrate W, is etched by supplying the high-temperature processing liquid L containing a phosphoric acid solution to the processing device 100 by the processing liquid supply device 1. Since the boiling liquid has the highest etching rate (maximum value), the phosphoric acid solution is processed near the boiling point. However, since the processing by the boiling liquid may damage the wafer as well, the phosphoric acid solution is practically used at a temperature slightly lower than the boiling point. Even in this case, it is effective to maintain the concentration of the phosphoric acid in the processing liquid L to be high in order to obtain a relatively high etching rate.

In general, the temperature at which the processing liquid supply device 1 can stably supply the processing liquid L is approximately 160° C., and the concentration of the processing liquid L containing the phosphoric acid solution is approximately 87.7%. Therefore, in the processing liquid supply device 1, the new liquid replenished with the concentration of 86% is heated and boiled to evaporate the water and increase the concentration.

In this case, when the entire processing liquid L in the tank T is heated, the boiling is started in the entire tank T, and the continuous increase in the concentration is dangerous and difficult to implement. For example, when the entire tank T is heated to increase the concentration, a large amount of processing liquid L may be boiled at once. In this case, various phenomena may occur such as a fluctuation in the liquid level of the tank T, steam leakage due to the increase in the internal pressure of the tank T caused by the water vapor that increases at once, and an inflow of the processing liquid L into an exhaust pipe. For this reason, the processing liquid L sucked from the tank T by the pump P is heated and boiled by the in-line heating unit H and then returned to the tank T as described above. In this manner, the concentration and temperature of the processing liquid L in the tank T are gradually increased. The boiling of the processing liquid L occurs in a pipe that returns to the tank T after being heated, and when the processing liquid L is returned to the tank T, the generated water vapor is released from the surface of the tank T to the atmosphere and exhausted outside the apparatus.

In this manner, the concentration of the processing liquid L in the tank T is set to 87.7%, but the concentration in the tank T may not always be set to the same 87.7% by simply controlling the outlet temperature of the in-line heating unit H to 160° C. The reason is that the boiling temperature of the processing liquid L is changed with the air pressure at the outlet of the heating unit H.

When the tank T is replenished with the low-concentration new liquid and the concentration is controlled to the target value by heating and boiling, the change in the boiling point with the air pressure may be illustrated by the vapor pressure curve illustrated in FIG. 2 as described above. In the case of the air pressure Pa, which is relatively high, the boiling point temperature Ta of the target concentration is set as a predetermined temperature. When heating the processing liquid L, the processing liquid L having the concentration decreased due to the replenishment of the new liquid begins to boil at a temperature lower than the set predetermined temperature, and the concentration gradually increases. Finally, when the temperature of the processing liquid L becomes close to the set temperature, the heating of the heating unit H becomes weak, and the temperature of the tank T reaches the target temperature. At this time, the concentration of the processing liquid L in the tank T reaches the target concentration.

However, when heating the processing liquid L and the air pressure increases (Pb to Pa), the boiling temperature increases (Tb to Ta). As described above, the temperature at which the processing liquid L boils, that is, the temperature that reaches the saturated vapor pressure, is changed with the air pressure. For this reason, the concentration of the processing liquid L while it is boiling is changed as well. Then, in the case of the air pressure Pb, which is relatively low, when the set temperature is set to the boiling point temperature Ta, the processing liquid L in the tank T is boiled and the temperature is increased to the boiling point temperature Ta. That is, the vapor pressure curve of the processing liquid L becomes a vapor pressure curve for the concentration value higher than the target concentration. Therefore, at an a point, the processing liquid L has the concentration value higher than the target concentration.

In order to prevent the above-described situation, it is necessary to obtain the vapor pressure curve for the target concentration in advance, and when the set temperature is modified according to the atmospheric pressure at the time of heating, the processing liquid L in the tank T may reach the target concentration by only controlling the temperature by heating. For example, it is possible to obtain the temperature when the concentration of the processing liquid L becomes 87.7% when heating and boiling the processing liquid L having a low concentration, by studying the boiling temperature of the processing liquid L containing the phosphoric acid solution having the concentration of 87.7% with the change in the atmospheric pressure, and measuring the atmospheric pressure of the atmosphere in which the processing liquid supply device 1 is disposed, that is, the atmospheric pressure of the place where the processing liquid supply device 1 is installed. In the processing liquid supply device 1, when the obtained temperature is set as a set temperature and the processing liquid L in the tank T is continuously heated to reach the target temperature, it is possible to obtain the processing liquid L of the target concentration of 87.7%. Thereafter, the temperature and concentration may simply be maintained. As described above, when the concentration of the processing liquid L in the tank T is controlled, the concentration of the tank T may be constantly maintained.

Further, as described above, when the concentration at the time when the temperature of the processing liquid L in the tank T reaches the target temperature indicates the concentration value of 87.7% by the densitometer D, it may be determined that the densitometer D normally measures the concentration. That is, it is possible to check whether the densitometer D is normally operated by confirming whether the measured value of the densitometer D is within the allowable value of the set concentration including measurement errors, and, it is possible to determine whether the subsequent concentration control is possible by the densitometer D.

[Effect]

(1) The present embodiment relates to the processing liquid supply device 1 that supplies the processing liquid L to the processing device 100 that processes the substrate W with the processing liquid L. The processing liquid supply device 1 includes: the tank T that stores the processing liquid L; the supply path S that supplies the processing liquid L from the tank T to the processing device 100; the heating unit H that heats the processing liquid L; the thermometer TM that measures the temperature of the processing liquid L; the densitometer D that measures the concentration of the processing liquid L; and the inspecting unit 23 that inspects the densitometer D.

The inspecting unit 23 includes: a temperature setting unit 231 that sets the boiling point temperature at which the predetermined concentration is reached as the predetermined temperature, based on the atmospheric pressure at the place where the processing liquid supply device 1 is installed and the preset vapor pressure curve of the processing liquid L; the heating control unit 232 that heats the processing liquid L by the heating unit H so as to reach the target temperature within a predetermined range based on the predetermined temperature; and the determination unit 233 that determines whether or not the concentration of the processing liquid L that reaches the target temperature, which is measured by the densitometer D, is the target concentration within the predetermined range based on the predetermined concentration.

Further, the method for inspecting the processing liquid supply device 1 of the present embodiment includes: setting the boiling point temperature at which a predetermined concentration is reached as a predetermined temperature, based on the atmospheric pressure at the place where the processing liquid supply device 1 that supplies the processing liquid L to the processing device 100 that processes the substrate W with the processing liquid L is installed and the preset vapor pressure curve of the processing liquid L; heating the processing liquid L by the heating unit H so that the temperature of the processing liquid L measured by the thermometer TM reaches the target temperature based on the predetermined temperature; and determining whether or not, when the processing liquid L reaches the target temperature, the concentration of the processing liquid L measured by the densitometer D that measures the concentration of the processing liquid L is the target concentration within the predetermined range based on the predetermined concentration.

As described above, since it is possible to check whether or not the densitometer D is normal by heating the processing liquid L and comparing the concentration, it is possible to reduce the occurrence of the product defects due to the processing by the processing liquid L having the concentration deviated from the normal value. When the function of the densitometer D has a problem, the processing may be stopped, and thus, the product defects may be prevented preemptively. The heating of the replenished processing liquid L occurs often during the procedure of supplying the processing liquid L, and the densitometer D may be inspected for each time. Therefore, the waiting for the processing due to the operations such as cleaning or correcting of the densitometer D may be suppressed. Further, unlike the method in which an alternative measure is continuously used when there is an abnormality in the densitometer D such as a failure in the densitometer D that makes it impossible to continue the use, it is still possible to process with a high accuracy since the densitometer D may be inspected while checking the amount of the deviation from the normal value. For example, even the change in the measured value due to the contaminants may be inspected.

(2) When the determination unit 233 determines that the concentration of the processing liquid L is not the target concentration and is higher than the target concentration, the heating control unit 232 dilutes the processing liquid L so that the processing liquid L has the concentration lower than the target concentration and the temperature lower than the target temperature, and then, heats the processing liquid L again by the heating unit H to reach the target temperature, and the determination unit 233 determines again whether or not the concentration of the processing liquid L that reaches the target temperature, which is measured by the densitometer D, is the target concentration.

When the determination unit 233 determines again that the target concentration is not reached, the output unit Eo outputs information that notifies that the target concentration is not reached. For this reason, the operator may recognize the abnormality of the densitometer D, allowing the operator to determine whether or not to continue the processing.

(3) The cleaning processing unit 24 is provided to perform the cleaning processing on the densitometer D when the determination unit 233 determines that the target concentration is not reached. For this reason, when the measured value of the densitometer D is deviated, the cleaning processing is performed to restore the function, and thus, the occurrence of the product defects may be reduced.

(4) The processing liquid supply device 1 includes the barometer B that measures the atmospheric pressure. For this reason, it is possible to accurately measure the air pressure at the place where the processing liquid supply device 1 is installed.

(5) The processing liquid supply device 1 includes the dilution unit I that dilutes the processing liquid L with the diluent, and the tank T that includes: the supply tank T1 that supplies the processing liquid L to the processing device 100; the recovery tank T2 that recovers the processing liquid L used to process in the processing device 100; and the new liquid tank T4 that supplies the processing liquid L that is new. The processing liquid supply device 1 includes the control device E that includes the concentration control unit 22 that, when the determination unit 233 determines that the concentration is within the predetermined range, adjusts the concentrations of the processing liquids L in the supply tank T1, the recovery tank T2, and the new liquid tank T4 by controlling the heating unit H and the dilution unit I based on the concentration measured by the densitometer D.

For this reason, the reliability of the control of the other tanks T on which the concentration control is performed by the densitometer D is increased, by checking the function of the densitometer D with the processing liquids L of any of a plurality of tanks T.

[Modification]

In the above-described embodiment, the following Modification may be configured.

(1) The allowable range for the set concentration may be set in two stages. Then, when the allowable range of the first stage is exceeded, the cleaning of the densitometer D may be performed, and when the allowable range of the second stage is exceeded, the supply of the processing liquid L may be stopped.

(2) When a plurality of densitometers D is used instead of only one densitometer D, it is possible to confirm whether or not the function of each densitometer D is normal. For example, the densitometer D may be provided on the path connecting the pipe t4 and the pipe t2 illustrated in FIG. 1 and on the path connecting the pipe t4 and the pipe t1. Further, the buffer tank T3 may be omitted, and the processing liquid L may be provided from the recovery tank T2 to the supply tank T1.

(3) In the aspects described above, the processing liquid L is diluted by adding water, but the dilution, that is, the concentration decrease may be promoted by adding the low-concentration new liquid. Further, since it is sufficient for the processing liquid L to be able to control the concentration and temperature when being supplied to the processing device 100 to predetermined values, it is not necessary to adjust the target concentration of the buffer tank T3 or the recovery tank T2 to the target concentration of the supply tank T1. That is, the target concentration may be changed for each tank T. For example, the target value may be changed according to the difference in the controllability of heating and the controllability of adding water.

(4) The present disclosure is not limited to the case where the entire or a part of the inspecting unit 23 and the storage unit 25 are configured in the control device E that controls the entire processing liquid supply device 1. The inspecting unit 23 and the storage unit 25 may be configured in a control device separated from the control device E, and may be configured in a control unit such as the thermometer TM and the densitometer D.

From the foregoing, it will be appreciated that various embodiments of the present disclosure have been described herein for purposes of illustration, and that various Modifications may be made without departing from the scope and spirit of the present disclosure. Accordingly, the various exemplary embodiments disclosed herein are not intended to be limiting, with the true scope and spirit being indicated by the following claims.

What is claimed is:

1. A processing liquid supply device comprising:
a tank configured to store a processing liquid;
a supply path configured to supply the processing liquid from the tank to a processing device that processes a substrate with the processing liquid;
a heater configured to heat the processing liquid;
a thermometer configured to measure a temperature of the processing liquid;
a densitometer configured to measure a concentration of the processing liquid; and
a controller configured to control an overall operation of the processing liquid supply device and including an inspecting unit configured to inspect the densitometer,
wherein the inspecting unit includes:
a temperature setting circuitry that sets a boiling point temperature at which a predetermined concentration is reached, as a predetermined temperature, based on an atmospheric pressure at a place where the processing liquid supply device is provided and a preset vapor pressure curve of the processing liquid;
a heating control circuitry that controls the heater to heat the processing liquid to a target temperature within a predetermined range based on the predetermined temperature; and
a determination circuitry that determines whether the concentration of the processing liquid that reaches the target temperature, which is measured by the densitometer, is a target concentration within a predetermined range based on the predetermined concentration.

2. The processing liquid supply device according to claim 1, wherein, when the determination circuitry determines that the concentration of the processing liquid is not the target concentration and is higher than the target concentration, the heating control circuitry dilutes the processing liquid so that the processing liquid has a concentration lower than the target concentration and a temperature lower than the target temperature, and then, heats the processing liquid again by the heater to reach the target temperature, and
the determination circuitry determines again whether the concentration of the processing liquid that reaches the target temperature, which is measured by the densitometer, is the target concentration.

3. The processing liquid supply device according to claim 2, further comprising:
an output unit configured to output information that notifies that the determination circuitry determines again that the concentration of the processing liquid is not the target concentration.

4. The processing liquid supply device according to claim 1, further comprising:
a cleaning processing circuitry configured to perform a cleaning processing on the densitometer when the determination circuitry determines that the target concentration is not reached.

5. The processing liquid supply device according to claim 1, further comprising:
a barometer configured to measure the atmospheric pressure.

6. The processing liquid supply device according to claim 1, further comprising:
a dilution unit including a feeding pipe configured to dilute the processing liquid with a diluent,
wherein the tank includes:
a supply tank that supplies the processing liquid to the processing device;
a recovery tank that recovers the processing liquid used in the processing device; and
a new liquid tank that supplies a new processing liquid, and
wherein the controller of the processing liquid supply device further includes:

a concentration control circuitry configured to, when the determination circuitry determines that the target concentration is reached, control the heater and the dilution unit based on the concentration measured by the densitometer, thereby adjusting the concentration of the processing liquid in the supply tank, the recovery tank, and the new liquid tank.

7. A substrate processing apparatus comprising:

a processing device configured to process a substrate; and the processing liquid supply device according to claim 1.

\* \* \* \* \*